United States Patent [19]
Hikosaka

[11] Patent Number: 5,144,378
[45] Date of Patent: Sep. 1, 1992

[54] HIGH ELECTRON MOBILITY TRANSISTOR
[75] Inventor: Kohki Hikosaka, Atsugi, Japan
[73] Assignee: Fujitsu Limited, Kawasaki, Japan
[21] Appl. No.: 774,137
[22] Filed: Oct. 15, 1991

Related U.S. Application Data
[63] Continuation of Ser. No. 664,696, Mar. 5, 1991, abandoned.

Foreign Application Priority Data
Mar. 6, 1990 [JP] Japan .................. 2-53924

[51] Int. Cl.$^5$ .............................. H01L 29/80
[52] U.S. Cl. ........................... 357/22; 357/16
[58] Field of Search ................. 357/22 A, 16

[56] References Cited

U.S. PATENT DOCUMENTS
5,023,675  6/1991  Ishikawa ..................... 357/22 A

FOREIGN PATENT DOCUMENTS
0301862  2/1989  European Pat. Off. .......... 357/22 A
1-256175  10/1989  Japan .
2-5438  1/1990  Japan .
0012839  1/1990  Japan ...................... 357/22 A

OTHER PUBLICATIONS
Yoh, et al., "An InAs Channel Heterojunction Field Effect Transitor with High Transconductance", *IEEE Electron Device Letters*, vol. II, No. 11 Nov. 1990, pp. 526–527.
Patent Abstracts of Japan, vol. 12, No. 196 (E-168) (3043), Jun. 7, 1988 and JP-A62-298 181.
Patent Abstracts of Japan, vol. 14, No. 568 (E-1014) (4511), Dec. 18, 1990 and JP-A-2 246 342.

*Primary Examiner*—James W. Davie
*Attorney, Agent, or Firm*—Nikaido, Marmelstein, Murray & Oram

[57] ABSTRACT

A semiconductor device comprises a substrate, a channel layer provided on the substrate and formed of an undoped first semiconductor material containing indium arsenide, a two-dimensional electron gas formed in the channel layer as a substantially scatter-free path of electrons, an electron supplying layer provided on the channel layer to form a heterojunction interface with the channel layer, a source electrode provided on the electron supplying layer for injecting electrons, a drain electrode provided on the electron supplying layer for collecting electrons and a gate electrode provided on the electron supplying layer for controlling the passage of the electrons in the two-dimensional electron gas. The electron supplying layer comprises a second compound semiconductor material having a lattice constant matching to the channel layer and doped to the n-type to form the two-dimensional electron gas. The second compound semiconductor material has a valence band having an energy level higher than the conduction band of the channel layer at the heterojunction interface, and the second compound semiconductor material is doped to a concentration level such that the Fermi level is located between the valence band and the conduction band of the second compound semiconductor material forming the electron supplying layer.

13 Claims, 6 Drawing Sheets

HIGH ELECTRON MOBILITY TRANSISTOR

This application is a continuation of application Ser. No. 07/664,696 filed Mar. 5, 1991, now abandoned.

BACKGROUND OF THE INVENTION

The present invention generally relates to semiconductor devices, and in particular to a high electron mobility transistor that uses InAs or a mixed crystal thereof for the channel layer.

The high electron mobility transistor known as HEMT is a semiconductor device that utilizes the two-dimensional electron gas formed at the heterojunction interface between a doped compound semiconductor layer called electron supplying layer and an undoped compound semiconductor layer called channel layer acting as the active layer of the device. In this device, the two-dimensional electron gas is formed within the undoped compound semiconductor layer along the heterojunction interface, and the electrons in the two-dimensional electron gas are transported through the channel layer without impurity scattering by the dopant atoms. Thereby, the operational speed of the device is maximized.

Conventionally, group III-V compound semiconductors such as GaAs have been used for the channel layer of HEMT because of the large electron mobility in these compound semiconductor materials. On the other hand, efforts are made in search of materials that provide still higher electron mobility and a larger electron density in the two-dimensional electron gas when combined with a suitable electron supplying layer. Thus, the search of materials for the channel layer of HEMT includes also the search of materials for the electron supplying layer.

So far, InAs and InSb are known as the material that provides the highest electron mobility. For example, InAs shows the effective mass of electrons of only 0.022 $m_o$ in the $\Gamma$-valley of the conduction band, wherein $m_o$ represents the mass of electron. This value is substantially smaller than the effective mass of electrons in the $\Gamma$-valley of GaAs, which is about 0.068 $m_o$. Similarly, the effective mass of electrons in the $\Gamma$-valley of InSb is only $0.014 m_o$, which is even smaller than the case of InAs. Further, these materials form a large discontinuity in the band structure when contacted with other compound semiconductor material. This feature is particularly advantageous in forming a large electron density in the two-dimensional electron gas formed at the heterojunction interface of HEMT.

InAs or InSb provides an additional advantageous feature of large transition energy between the $\Gamma$-valley and the X- or L-valley in the conduction band. The latter feature is particularly advantageous for eliminating the real space transfer wherein the electrons, accelerated by the high electric field across the source and gate, cause a transition within the conduction band of the channel layer to the higher energy state corresponding to the X- or L-valley. The electron thus excited subsequently cause a transfer from the channel layer to the lower energy state in the electron supplying layer, moving across the heterojunction interface. The large transition energy within the conduction band effectively suppresses the problem of this real space transfer. Thus, the HEMT that uses InAs or InSb for the active layer is expected to exhibit a superior operational characteristic as compared to the conventional HEMTs.

On the other hand, InAs or InSb has a large lattice constant that is substantially larger than the lattice constant of GaAs or other conventionally used compound semiconductor materials. For example, InAs has a lattice constant of 6.058 Å while InSb has a lattice constant of 6.479 ÅA. Thereby, a problem arises about the material that can be used for the electron supplying layer that forms the heteroepitaxial interface with InAs or InSb. Because of these problems, there are limited number of reports about the HEMT that uses the channel layer of InAs or a mixed crystal thereof.

FIG. 1 shows the typical structure of a HEMT, wherein the device comprises a semi-insulating substrate 11 of GaAs and a buffer layer 12 of undoped AlGaSb grown epitaxially thereon.

On the buffer layer 12, a channel layer 13 of InAs is grown epitaxially, and an n-type electron supplying layer 14 of AlSb or GaSb is grown on the channel layer 13. Thereby, a heterojunction interface is formed at a boundary 13a between the channel layer 13 and the electron supplying layer 14, and a two-dimensional electron gas 2DEG is formed along the interface 13a as is well known. On the electron supplying layer 14, there is provided an n-type GaAs or GaSb cap layer 15, and an electrode structure comprising a source electrode 16a of a gold-tin alloy (AuSn), a drain electrode 16b also of the gold-tin alloy, and a gate electrode 16c of aluminum, is provided on the cap layer 15.

At present, GaSb and AlSb are the only conceivable candidates for the electron supplying layer in view point of the lattice matching with the InAs channel layer 13. However, AlSb, containing aluminum, is susceptible to oxidation and causes difficulty in fabrication as well as use of the device. More specifically, AlSb tends to form aluminum oxide during the fabrication process or during the use of the device, and it is necessary to provide a protection to prevent the oxidation. However, such a process complicates the fabrication of the device and hence the reliability as well as the cost of the device.

GaSb, on the other hand, forms the so-called type three heterojunction when formed adjacent to InAs. In the second type heterojunction, there is formed a two-dimensional hole gas in the electron supplying layer along the heterojunction in addition to the two-dimensional electron gas in the channel layer. When such a two-dimensional hole gas is formed simultaneously to the two-dimensional electron gas along the same channel, the controlled flow of the carriers by the electric field applied to the gate electrode 16c does not hold anymore. In other words, the device does not operate properly.

FIG. 2 shows the band structure of the heterojunction interface formed between the InAs channel layer and the GaSb electron supplying layer in the structure of HEMT of FIG. 1. In relation to the small effective mass of the electrons and holes, InAs or the mixed crystal thereof generally has a relatively small band gap between the valence band Ev and the conduction band Ec. Particularly, when combined with GaSb electron supplying layer, the edge of the conduction band Ec of the InAs channel layer 13 is located at a level lower than the edge of the valence band Ev of the GaSb electron supplying layer 14. In this system, it should be noted that the Fermi level $E_F$ is located between the conduction band of the InAs channel layer 13 and the valence band of the GaSb electron supplying layer 14 as illustrated. Thus, there is formed the two-dimensional hole gas designated as 2DHG adjacent to the two-dimensional electron gas designated as 2DEG. As the holes behave oppositely to the electrons under the electric field, the simultaneous existence of 2DEG and 2DHG causes a serious problem in the operation of the HEMT as already described.

SUMMARY OF THE INVENTION

Accordingly, it is a general object of the present invention to provide a novel and useful high electron mobility transistor wherein the foregoing problems are eliminated.

Another and more specific object of the present invention is to provide a high electron mobility transistor having an increased operational speed.

Another object of the present invention is to provide a high electron mobility transistor, comprising an undoped channel layer containing one or both of InAs and InSb and an n-type electron supplying layer that forms a heterojunction interface with the undoped channel layer, wherein the n-type electron supplying layer has a lattice constant that matches with the lattice constant of the channel layer and has a band structure wherein the formation of two-dimensional hole gas in the electron supplying layer along the heterojunction interface is eliminated.

Another object of the present invention is to provide a high electron mobility transistor having an improved operational speed, comprising an undoped channel layer containing InAs and an n-type electron supplying layer provided adjacent to the channel layer with a heterojunction interface formed between the channel layer and the electron, supplying layer, wherein the electron supplying layer comprises a mixed crystal of AlGaSb with a composition represented as $Al_yGa_{1-y}Sb$, with a compositional parameter y set as $0.3 < y \leq 0.6$. According to the present invention, the electron supplying layer can be provided on the channel layer with the lattice matching therewith while suppressing the formation of the two-dimensional hole gas. Further, by setting the compositional parameter y as such, the problem of oxidation of aluminum as well as formation of deep impurity level in the electron supplying layer is eliminated.

Another object of the present invention is to provide a high electron mobility transistor having an improved operational speed, comprising an undoped channel layer containing InAs and an n-type electron supplying layer provided adjacent to the channel layer with a heterojunction interface formed between the channel layer and the electron supplying layer, wherein the electron supplying layer comprises a mixed crystal of AlGaSb having a composition $Al_yGa_{1-y}Sb$ with a compositional parameter y set equal to or less than 0.3, and wherein the electron supplying layer is doped by a dopant with a concentration level of at least $3 \times 10^{17}$ cm$^{-3}$ or more. According to the present invention, the Fermi level is shifted because of the doping of the electron supplying layer and the formation of the two-dimensional hole gas in the electron supplying layer along the heterojunction interface is eliminated.

Another object of the present invention is to provide a high electron mobility transistor having an improved operational speed, comprising an undoped channel layer containing one or both of InAs and InSb, and a doped electron supplying layer provided adjacent to the channel layer for forming a heterojunction interface therebetween, wherein the electron supplying layer comprises a mixed crystal of InAs having a composition represented as $Al_yIn_{1-y}As$ with a compositional parameter y set to satisfy a relation $0.06 \leq y \leq 0.6$. According to the present invention, the formation of the two-dimensional hole gas in the electron supplying layer along the heterojunction interface is eliminated because of the band structure of AlInAs wherein the upper edge of the valence band is located at a level energetically slightly higher than the lower edge of the valence band of the channel layer. Further, by choosing the composition as such, a satisfactory lattice matching can be achieved between the electron supplying layer and the channel layer.

Other objects and further features of the present invention will become apparent from the following detailed description when read in conjunction with the attached drawings.

DETAILED DESCRIPTION

Figure 1:
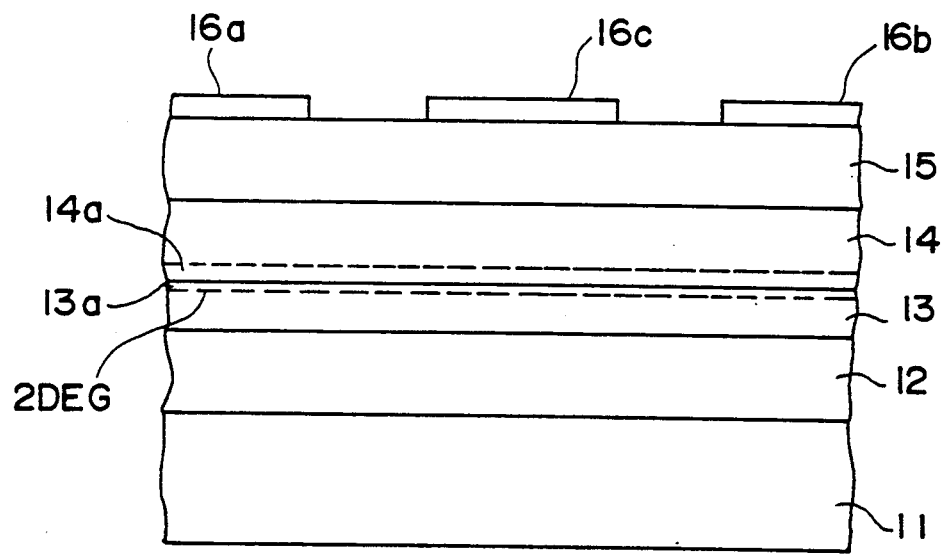
FIG. 1 is a diagram showing the structure of a typical HEMT.

Hereinafter, various embodiments of the present invention will be described with reference to the structure of FIG. 1 showing the fundamental structure of a HEMT. It should be noted that the structure of HEMT of the present invention is generally identical with the structure shown in FIG. 1. The difference exists in the materials forming the layers of the device.

In a first embodiment, the substrate 11 comprises a semi-insulating GaAs substrate similar to the conventional case. The buffer layer 12 is formed of undoped AlGaSb and may have a composition of $Al_{0.2}Ga_{0.8}Sb$. The layer 12 is grown on the substrate 11 epitaxially with a thickness of 0.5 μm.

On the buffer layer 12, the channel layer 13 of undoped InAs is grown by depositing InAs with a thickness of 0.1 μm. This InAs channel layer 13 has the lattice constant of 6.058 Å and establishes a lattice matching with the underlying buffer layer 12 that has a lattice constant of about 6.10 Å.

Further, on the channel layer 13, the electron supplying layer 14 of n-type $Al_{0.2}Ga_{0.8}Sb$, doped by Te with the concentration level of $1 \times 10^{18}$ cm$^{-3}$, is provided with a thickness of 0.07 μm. This electron supplying layer, having the composition identical with the composition of the buffer layer 12, has the lattice constant of 6.10 Å and establishes a satisfactory lattice matching with the channel layer 13. The composition of the layer 14, however, is not limited to the above composition as will be described later.

On the electron supplying layer 14, the cap layer 15 is provided by depositing an n-type GaAs layer with a thickness of 0.02 μm, for establishing an ohmic contact between the source and drain electrodes 16a and 16b and the electron supplying layer 14 Similar to the conventional HEMTs, the source and drain electrodes 16a and 16b comprise the gold-tin alloy for establishing the ohmic contact with the cap layer 15, while the gate electrode 16c comprises aluminum and establishes the Schottky contact.

In the present embodiment, it should be noted that the composition of the electron supplying layer 14 is relatively close to GaSb because of the small content of aluminum (y=0.2 when the composition is represented as $Al_yGa_{1-y}Sb$). In this case, the electron supplying layer 14 forms the second type heterojunction similar to the one shown in FIG. 2 when not doped properly. The applicant of the present invention has found that the two-dimensional hole gas pertinent to the band structure of FIG. 2 appears only when the content y of aluminum representing the composition $Al_yGa_{1-y}Sb$ of the electron supplying layer 14 has decreased below about 0.3. For example, the above composition of the layer 14 is included in this range, and thus, it is expected that the two-dimensional hole gas is formed at the heterojunction interface.

In order to avoid the formation of the two-dimensional hole gas at the heterojunction interface in the material system wherein the compositional parameter y set less than 0.3, the present invention intentionally induces a shift in the Fermi level by introducing the dopant atoms with a concentration level of $3 \times 10^{17}$ cm$^{-3}$ or more, preferably about $1 \times 10^{18}$ cm$^{-3}$ or more.

Figure 3:
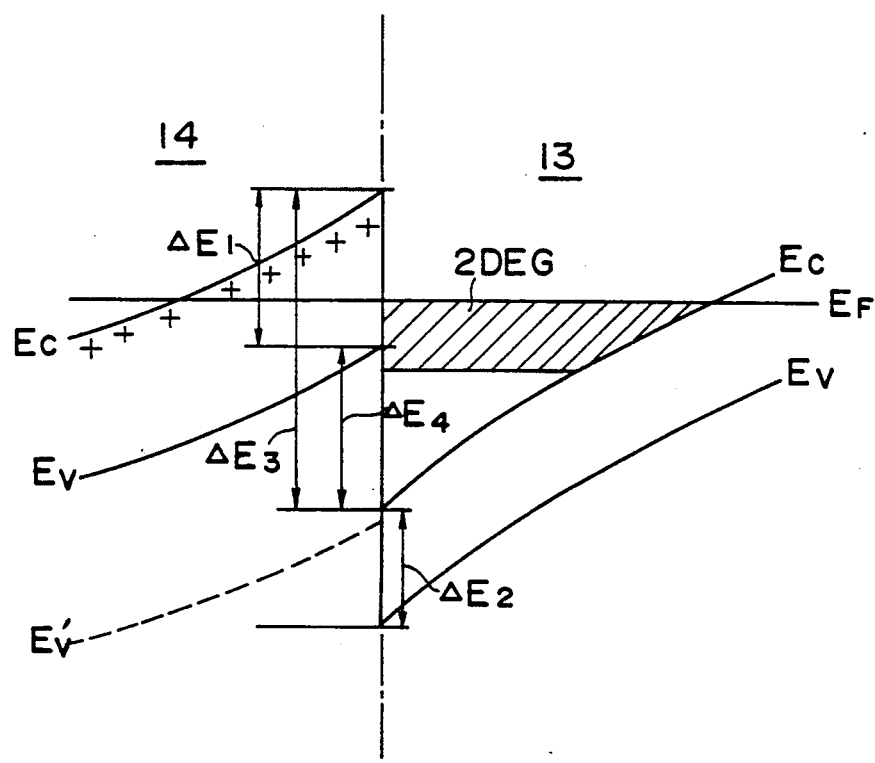
FIG. 3 is a band diagram showing the band structure obtained by an embodiment of the present invention.

FIG. 3 shows the band structure obtained by the first embodiment. Referring to FIG. 3, the band gap ΔE1 of the layer 14 has a value of about 0.72-1.2 eV while the band gap ΔE2 of the InAs channel layer has a value of 0.35 eV. Between the conduction band Ec of the electron supplying layer 14 and the conduction band Ec of the channel layer 13, an energetical discontinuity ΔE3 of about 0.87-0.95 eV is formed. Further, the upper edge of the valence band Ev of the electron supplying layer 14 is located above the lower edge of the conduction band Ec of the channel layer 13 with an energetical gap ΔE4 of about 0.15-0 eV. As will be remarked later, the value ΔE4 changes with the parameter y representing the content of aluminum in the electron supplying layer 14.

As already noted, such a band structure induces the formation of two-dimensional hole gas in the electron supplying layer 14 when the Fermi level $E_F$ is located between the valence band Ev of the layer 14 and the conduction band Ec of the channel layer 13. The present embodiment eliminates the formation of the two-dimensional hole gas by causing a shift in the Fermi level $E_F$ in the energetical upward direction to a level between the conduction band Ec and the valence band Ev of the electron supplying layer 14.

Figure 2:
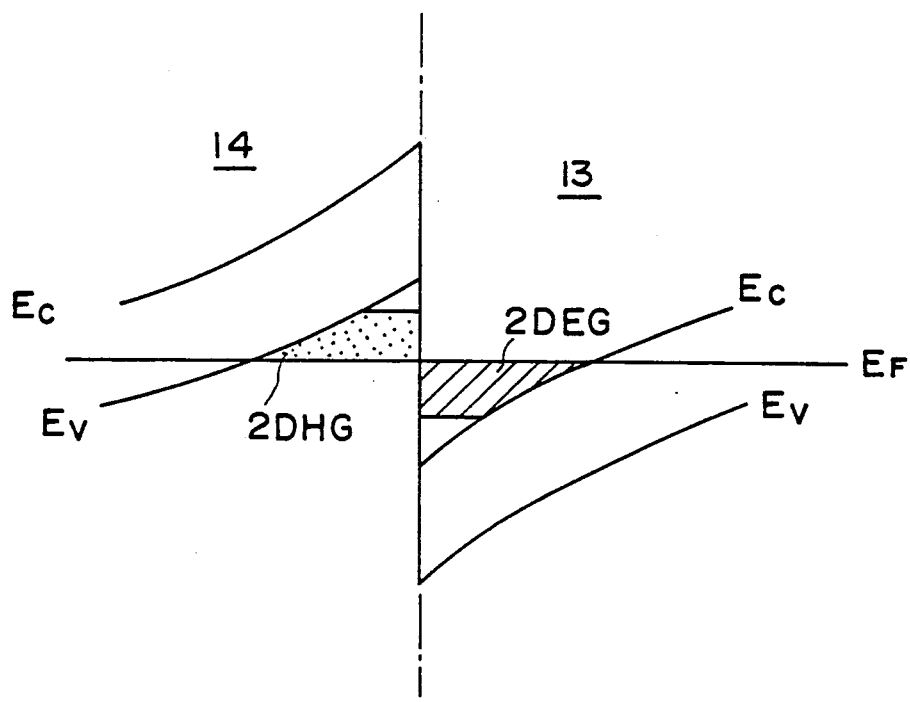
FIG. 2 is a band diagram showing the problem that occurs at the heterojunction interface of HEMT when InAs is used for the channel layer.

In order to achieve such a shift of the Fermi level, the present embodiment controls the doping level of the dopant atoms introduced into the electron supplying layer 14. It should be noted that these dopant atoms release the electrons when activated in the group III-V compound semiconductor materials, and the electrons thus released modify the condition of thermal equilibrium that determines the Fermi level. Thereby, the problem of formation of the two-dimensional hole gas in the layer 14 shown in FIG. 2 is eliminated. In the present embodiment, the dopant concentration level in the electron supplying layer 14 is set to be at least $0.3 \times 10^{17}$ cm$^{-3}$ or more, preferably about $1 \times 10^{18}$ cm$^{-3}$.

When the compositional parameter y is set 0.3 or more, on the other hand, the upper edge of the valence band of the layer 14 is shifted in the downward direction in the band diagram with increasing content of aluminum as shown by a band Ev' in FIG. 3. In other words, the band gap ΔE1 increases with increasing value of the parameter y, and when y has reached the value 0.3, the energetical gap ΔE4 becomes substantially zero. In this band structure, it should be noted that the two-dimensional hole gas pertinent to the band structure of FIG. 2, does not appear anymore. On the other hand, the increased content of aluminum in the electron supplying layer 14 beyond 0.3 increases the chance that the aluminum in the electron supplying layer 14 being oxidized and the resistivity of the layer 14 is increased. Although such an oxidation can be prevented by the provision of the GaAs cap layer 15 to certain extent even when the parameter y is set to 1 (y=1), it is preferred to keep the content y of aluminum not exceed 0.6 for the actually used devices.

About the lattice matching, the material in the system $Al_yGa_{1-y}Sb$ for the electron supplying layer 14 establishes a satisfactory lattice matching with InAs forming the channel layer 13 throughout the entire range of the parameter y. It should be noted that the range of lattice parameter in the system of AlGaSb is relatively small and falls within the range of 0.05 Å. On the other hand, it is generally accepted that a lattice discrepancy exceeding about 4%, typically in the case where the critical thickness of the film in which dislocations are induced is several tens of angstroms, is not allowable for achieving the heteroepitaxial growth with the quality of the crystal layers sufficient to form the active part of a HEMT. As long as the lattice discrepancy falls within the foregoing limit, the characteristic of HEMT is not substantially altered. On the other hand, when the lattice discrepancy exceeds the limit of 4%, the strain across the heterojunction interface induces dislocations in the channel layer and the electrons passing therethrough experience scattering. The foregoing material system of AlGaSb for the electron supplying layer 14 satisfies the lattice matching against the InAs channel layer 13 for the entire compositional range of y. Further, the composition of the channel layer 13 may be changed between InAs and InSb as long as the layer 13 maintains the lattice matching with the electron supplying layer 14.

Next, a second embodiment of the present invention will be described with reference to the structure of FIG. 1.

In this embodiment, InP is used for the substrate 11, and the buffer layer 12 having the composition of $GaAs_{0.2}Sb_{0.8}$ is grown on the substrate 11 with a thickness of 0.5 μm. On the buffer layer 12, the channel layer 13 of InAs is formed by growing InAs epitaxially with a thickness of 0.03 μm. Note that $GaAs_{0.2}Sb_{0.8}$ has the lattice constant of about 6.01 Å.

On the channel layer 13, the electron supplying layer 14 of n-type GaAsSb is provided with the composition of $GaAs_{0.2}Sb_{0.8}$, with the thickness determined to be 0.05 μm. This material has the composition identical with the composition of the buffer layer and establishes the desired lattice matching against the channel layer 13. Further, the electron supplying layer 14 is doped by Te with the dopant concentration level of $1 \times 10^{18}$ cm$^{-3}$. It should be noted that there may be provided a thin spacer layer 14a of AlSb between the channel layer 13 and the electron supplying layer 14 for reducing the effect of potential of dopants in the electron supplying layer 14 on the electrons transported in channel layer along the heterojunction interface.

On the electron supplying layer 14, the cap layer of undoped GaAsSn having the composition of GaAs$_{0.2}$Sb$_{0.8}$ is provided with a thickness of 0.05 μm, and the source electrode 16a, drain electrode 16b and the gate electrode 16c are provided on the cap layer 16 as usual.

In this embodiment, too, the band structure across the channel layer 13 and the electron supplying layer 14 becomes substantially as shown in FIG. 3 by the solid lines except for small modification caused by the optional spacer layer 14a. In FIG. 3, the modification of the band structure by the spacer layer 14a is not illustrated for the sake of simplicity. Again, the formation of the two-dimensional hole gas is suppressed by the doping that is made in the electron supplying layer 14 with the dopant concentration level of $3 \times 10^{17}$ cm$^{-3}$ or more. Thereby, the Fermi level E$_F$ is shifted to the level between the conduction band Ec and the valence band Ev of the electron supplying layer 14. Otherwise, the band structure of FIG. 2 and associated two-dimensional hole gas would appear in the layer 14.

In the present embodiment, it should be noted that the range of composition of the electron supplying layer 14, represented by the compositional parameter y defining the composition GaAs$_y$Sb$_{1-y}$, may be changed in the range between zero and 0.6 ($0 \leq y \leq 0.6$) without loosing the lattice matching. In the case of y=0, the layer 14 takes the composition of GaSb of which lattice constant is 6.095 Å. This value is consistent with the lattice constant of the channel layer when the channel layer has the composition of InAs with small amount of InSb. When the parameter y exceeds 0.6, on the other hand, the lattice constant of the electron supplying layer 14 decreases below about 5.830 Å, and there arises the problem of lattice mismatching between the electron supplying layer 14 and the channel layer 13. It should be noted that the excessive increase of the parameter y causes a decrease in the lattice constant of the electron supplying layer 14 with respect to the channel layer 14. When the composition of the layer 14 is determined to satisfy the foregoing range, the composition of the channel layer 13 may be chosen as desired within the system of InAs-InSb as long as the lattice matching is maintained. It should be noted that the channel layer 13 of InAsSb changes the lattice constant between 6.058 Å and 6.479 Å and thus, it is preferred to set the content of InSb in the channel layer 13 within about 60% in the mole fraction in the case of y=0. The foregoing argument holds in the case when there is the spacer layer 14a of AlSb intercase posed between the channel layer 13 and the electron supplying layer 14.

Next, a third embodiment of the present invention will be described also with reference to FIG. 1 showing the general structure of typical HEMT.

In this embodiment, the substrate 11 comprises semi-insulating GaAs and the buffer layer 12 comprises undoped AlInAs having the composition of Al$_{0.4}$In$_{0.6}$As. The buffer layer 12 is grown with a thickness of 0.5 μm and has the lattice constant of 5.90 Å.

On the buffer layer 12, the channel layer 13 of InAsSb is grown with a thickness of 0.05 μm. The composition of the channel layer 13 is set to be InAs and has a lattice constant of 6.058 Å that differs from the lattice constant of the buffer layer by only 2.7%. Thereby, a satisfactory lattice matching is achieved with the underlying buffer layer 12.

The electron supplying layer 14 on the channel layer 13 has a thickness of 0.07 μm and comprises n-type AlInAs that has a composition of Al$_{0.4}$In$_{0.6}$As. Thereby, the layer 14 also achieves the desired lattice matching with the underlying channel layer 13. In order to provide the necessary conductivity, the electron supplying layer 14 is doped by Te with the level of $1 \times 10^{18}$ cm$^{-3}$.

The cap layer 15 on the electron supplying layer 14 comprises n-type GaAs and grown with a thickness of 0.02 μm. Further, the source electrode 16a, the drain electrode 16b and the gate electrode 16c are provided on the cap layer 15 as usual.

Figure 4:
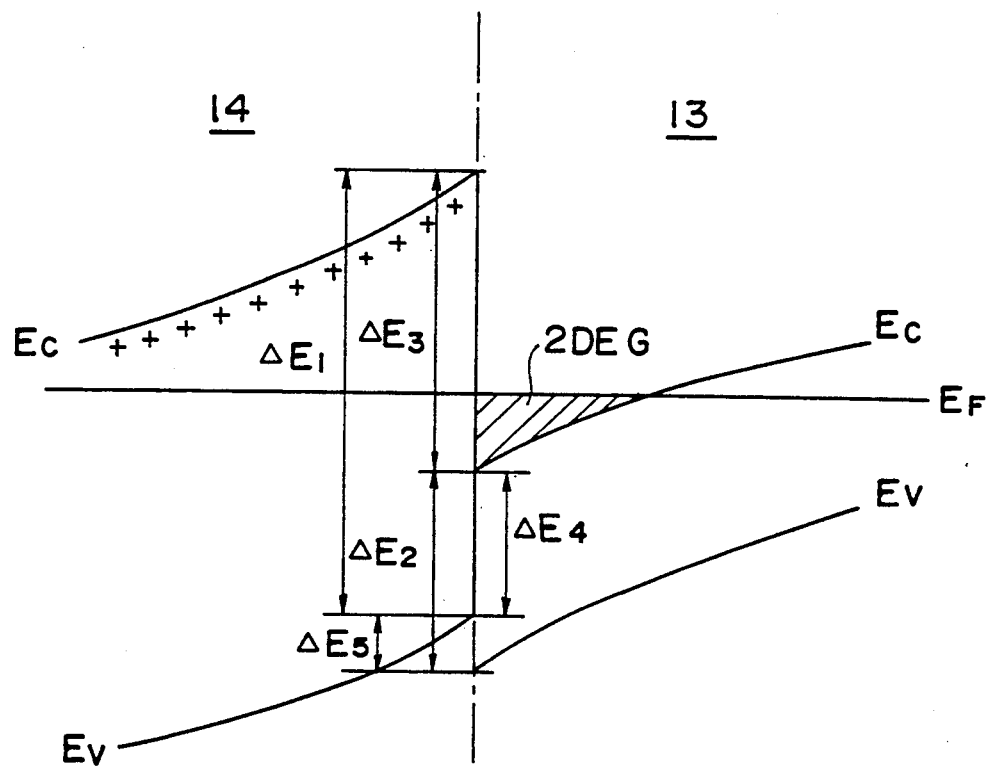
FIG. 4 is a band diagram showing the band structure obtained by another embodiment of the present invention.

In this embodiment, it should be noted that AlInAs forming the electron supplying layer 14 has a band gap much larger than the band gap of the channel layer 13 and forms a band structure similar to the one shown in FIG. 4. In this system, the energy gaps ΔE1, ΔE2, ΔE3 and ΔE4 in FIG. 4 assume the values of 1.276 eV, 0.36 eV, 1.046 eV and 0.23 eV, respectively. The energy gap ΔE5 between the upper edge of the valence band of the electron supplying layer 14 and the lower edge of the valence band of the channel layer 13 assumes the value of 0.13 eV. Thereby, the upper edge of the valence band Ev of the electron supplying layer 14 is located at an energetically slightly higher level than the lower edge of the valence band Ev of the channel layer 13, and the upper edge of the conduction band Ec of the electron supplying layer 14 is located above the lower edge of the conduction band Ec of the channel layer. Further, the lower edge of the conduction band Ec of the channel layer 13 is located below the Fermi level E$_F$. Thus, the material system of the present embodiment forming the heterojunction interface forms explicitly the two-dimensional electron gas and the problem of formation of the two-dimensional hole gas does not occur.

Further, the material system of AlInAs shows a wide variation of lattice constant depending on the compositional parameter y representing the composition Al$_y$In$_{1-y}$As, and associated therewith, there arises a problem of lattice mismatch against the channel layer 13 when the parameter y exceeds about 0.6. On the other hand, when the parameter y is set to be less than 0.06, the magnitude of the energy gap formed between the conduction bands across the heterojunction interface becomes smaller than 0.5 eV, which is thought to be the minimum energy gap needed for the operation of HEMT in the room temperature environment. Thus, the preferable compositional range of the parameter y is determined as $0.06 \leq y \leq 0.6$. On the other hand, the channel layer 13 may have any desired composition in the InAs - InSb system.

Next, a fourth embodiment of the present invention will be described again with reference to FIG. 1 showing the general structure of HEMT.

Referring to FIG. 1, the device of the present embodiment has the substrate 11 of GaAs, and the buffer layer 12 grown thereon comprises undoped AlGaAsSb having the composition of Al$_{0.2}$Ga$_{0.8}$As$_{0.4}$Sb$_{0.6}$. The buffer layer 12 has a thickness of 0.5 μm and has the lattice constant of 5.92 Å.

On the buffer layer 12, the channel layer 13 of undoped InAs$_{0.9}$Sb$_{0.1}$ is provided with a thickness of 0.005 μm. In this case, the buffer layer 12 has the lattice constant of 6.10 Å, and thus, a satisfactory lattice matching is achieved against the buffer layer 12.

On the channel layer 13, the electron supplying layer 14 of n-type AlGaAsSb is provided with the composition $Al_{0.2}Ga_{0.8}As_{0.4}Sb_{0.6}$ for a thickness of 0.07 μm, and the cap layer 15 of n-type GaAs is grown on the electron supplying layer 14 with a thickness of 0.02 μm. Further, the source electrode 16a, drain electrode 16b and the gate electrode 16c are provided on the cap layer 15 as usual.

In this embodiment, the composition of the electron supplying layer 14 can be changed with increased freedom. The material AlGaAsSb forming the layer 14 has a generalized representation of composition of $Al_yGa_{1-y}As_zSb_{1-z}$, wherein the parameter y can be changed from zero to 1 ($0 \leq y \leq 1$) in correspondence to the first embodiment and the parameter z can be changed from zero to 0.6 ($0 \leq z \leq 0.6$) in correspondence to the second embodiment. When the parameter y exceeds 0.6, however, the aluminum content in the electron supplying layer 14 increases excessively and the layer 14 tends to be oxidized. Thus, it is preferred to keep the parameter y smaller than 0.6 ($0 \leq y < 0.6$) Thereby, the foregoing problem of difficulty in fabrication and the unreliable operation occurs. When the parameter z exceeds 0.6, on the other hand, the problem of lattice mismatch arises.

When the parameter y is chosen to fall in the foregoing range, there are two distinct cases distinguished with each other at the value of parameter y of 0.3. Thus, when the parameter y is smaller than 0.3, the lower edge of the conduction band Ec of the channel layer 13 becomes energetically lower than the upper edge of the valence band Ev of the electron supplying layer 14 as shown in FIG. 2 or FIG. 3. Thus, when there is the Fermi level $E_F$ located therebetween, the two-dimensional hole gas is inevitably formed as shown in FIG. 2. In this case, therefore, the electron supplying layer 14 has to be doped such that the Fermi level shifts upward as shown in FIG. 3. For this purpose, the dopant concentration level of $3 \times 10^{17}$ cm$^{-3}$, preferably about $1 \times 10^{18}$ cm$^{-3}$ or more is necessary for causing the desired shift of the Fermi level.

On the other hand, when the parameter y is set equal to or larger than 0.3, the upper edge of the valence bond Ev of the electron supplying layer 14 decreases below the lower edge of the conduction band Ec of the channel layer 13 as shown by the conduction band Ev', and the formation of the two-dimensional hole gas is eliminated without particular level of doping in the electron supplying layer 14.

Next, a fifth embodiment of the present invention will be described again with reference to the basic structure of FIG. 5.

Figure 5:
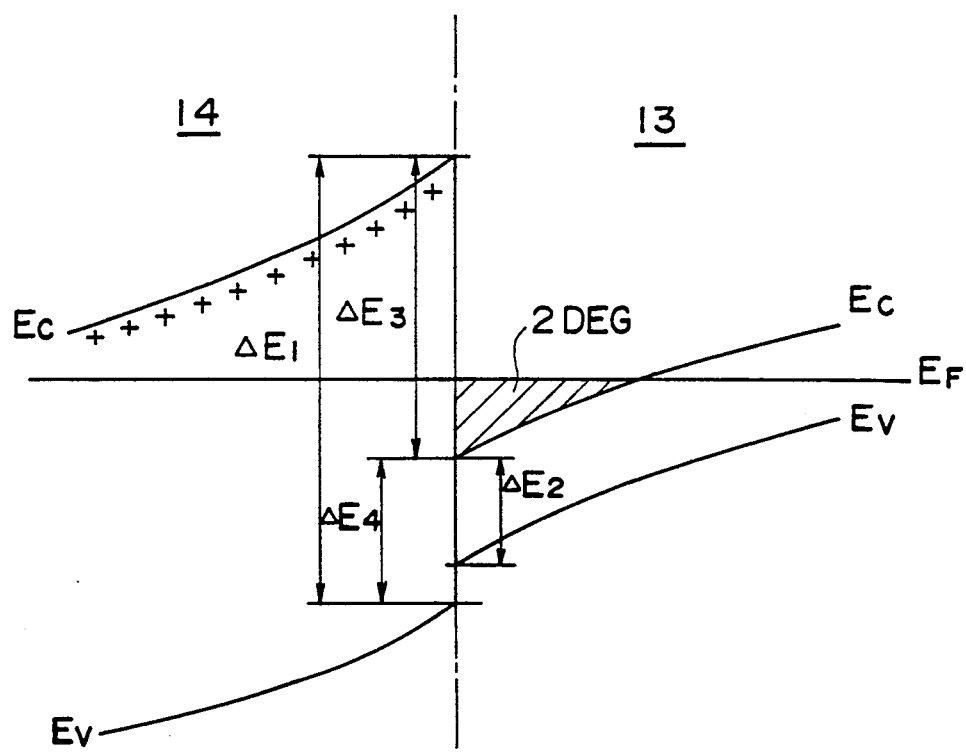
FIG. 5 is a band diagram showing the band structure obtained by another embodiment of the present invention.
Figure 6:
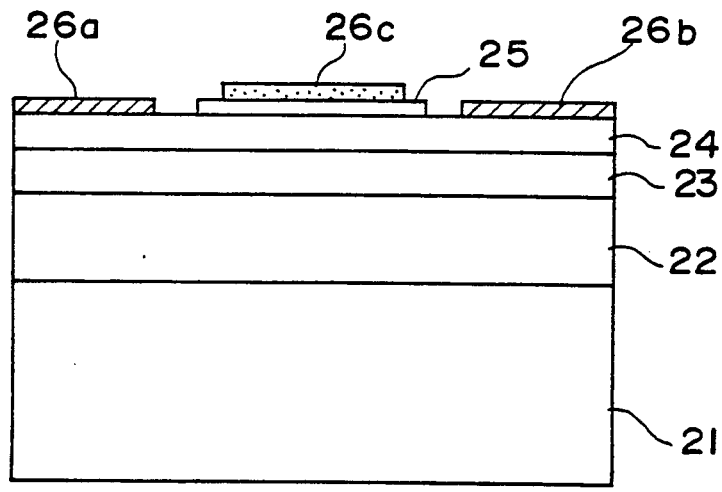
FIG. 6 is a diagram showing the structure of a SIS-FET according to a still other embodiment of the present invention.

The structure of FIG. 5 is known as the semiconductor-insulator-semiconductor field effect transistor (SISFET). In this embodiment, a substrate 21 comprising InP is used and a buffer layer 22 comprising an undoped layer of AlSb is grown on the substrate 21 with a thickness of 0.5 μm. On the buffer layer 22, an epitaxial layer 23 of undoped $InAs_{0.9}Sb_{0.1}$ is grown with a thickness of 0.05 μm as the channel layer, and an undoped barrier layer 24 is provided on the channel layer 23 by growing a layer of i-type ZnSeTe having a composition represented as $ZnSe_yTe_{1-y}$, with the compositional parameter y set between zero and 0.6 ($0 \leq y \leq 0.6$) and the thickness determined to be 0.02 μm. Further, on the undoped barrier layer 24, a second electron supplying layer 25 of n+-type $InAs_{0.9}Sb_{0.1}$ is grown with a thickness of 0.05 μm. On the undoped barrier layer 24, a source electrode 26a and a drain electrode 26b are provided with an ohmic contact therewith and a gate electrode 26c is provided on the top layer 26c with a Schottky contact therewith.

The system of the ZnSeTe layer 24 combined with the channel layer 23 forms the band structure shown in FIG. 5 and the formation of the two-dimensional hole gas is successfully eliminated. In this case, the energy gaps ΔE1, ΔE2, ΔE3 and ΔE4 respectively assume the values of 2.26 eV, 0.33 eV, 1.57 eV and 0.69 eV. Further, it should be noted that the lattice constant of $ZnSe_yTe_{1-y}$ changes the lattice constant in the range between 5.67 Å corresponding to the Te-free composition and 6.10 Å corresponding to the Se-free composition in correspondence to the range of the parameter y between zero and 0.6. This range of lattice constant is compatible with the lattice constant of the channel layer 13.

Next, a sixth embodiment of the present invention will be described.

In the present embodiment, the substrate 11 comprises semi-insulating InP, and an undoped InAsSb with a composition of $InAs_{0.8}Sb_{0.2}$ is provided directly thereon or via the buffer layer 12 of semi-insulating InP, as the channel layer 13 with a thickness of 5000 Å. On the channel layer 13, an InAs layer is provided with a thickness of 200 Å as the spacer layer 14a, and an n-type InPAs layer having a composition $InP_{1-x}As_x$ with the compositional parameter x between 0 and 0.8 ($0 \leq x \leq 0.8$) is provided on the spacer layer 14a as the electron supplying layer 14 with a thickness of 500 Å. Further, on the electron supplying layer 14, the n-type GaAs cap layer is provided with the thickness of 200 Å.

The structure of the present embodiment has the band structure similar to FIG. 5, wherein the energy gap ΔE1 takes a value of 1.27 eV, the energy gap ΔE2 takes a value of 0.35 eV, the energy value ΔE3 has the value of 0.42 eV, and the energy gap ΔE4 has the value of 0.85 eV. Thereby, the device of the present embodiment operates similar to the device of the third embodiment.

Further, the material for the electron supplying layer is not limited to these materials but quaternary materials such as InAlPAs, InGaPAs, InGaPSb or InAlPSb may be employed.

According to the present invention, an electron density of $3-5 \times 10^{12}$ cm$^{-2}$ is achieved in the two-dimensional electron gas. This value is about 2-3 times larger than the conventional value. Further, a transition energy of 1.1-1.2 eV can be achieved together with the electron mobility of $3 \times 10^5$ cm$^2$/V.s. The device thus constructed has a current drivability that is 2-3 times larger than the conventional value and the switching speed that is faster by 2-3 times. The cutoff frequency FT of 400-500 GHz is obtained for the device having the gate length of 0.1 μm. It should be noted that this value is 2-5 times larger than the conventional value.

Further, the present invention is not limited to the embodiments described heretofore but various variations and modifications may be made without departing from the scope of invention.

What is claimed is:

1. A semiconductor device, comprising:
   a substrate having an upper major surface and a lower major surface;
   a channel layer having an upper major surface and a lower major surface and provided on the upper major surface of the substrate, said channel layer comprising an undoped first group III-V compound semiconductor material having a first lattice constant and containing indium arsenide as a component, said first group III-V compound semiconductor material having a first conduction band characterized by a first energy level at the upper major surface of the channel layer and a first valence band characterized by a second energy level at the upper major surface of the channel layer such that the second energy level is separated from the first energy level by a first band energy gap;

a two-dimensional electron gas formed in the channel layer along the upper major surface thereof as a substantially scatter-free path of electrons;

an electron supplying layer having an upper major surface and a lower major surface and provided on the upper major surface of the channel layer so as to form a heterojunction interface between the upper major surface of the channel layer and the lower major surface of the electron supplying layer, said electron supplying layer comprising a second group III-V compound semiconductor material having a second lattice constant and doped to the n-type by a doping of impurity atoms and supplying electrons to the channel layer to form the two-dimensional electron gas therein;

source electrode means provided on the upper major surface of the electron supplying layer for injecting electrons into the electron supplying layer;

drain electrode means provided on the upper major surface of the electron supplying layer for collecting electrons from the electron supplying layer; and gate electrode means provided on the upper major surface of the electron supplying layer for controlling the passage of the electrons in the two-dimensional electron gas;

said second group III-V compound semiconductor material having a second conduction band characterized by a third energy level at the lower major surface of the electron supplying layer and a second valence band characterized by a fourth energy level at the lower major surface of the electron supplying layer such that the fourth energy level is separated from the third energy level by a second band gap, said second group III-V compound semiconductor material having a composition determined such that the second lattice constant matches to the first lattice constant so that the passage of the electrons through the two-dimensional electron gas occurs substantially identical with a case wherein the first and second lattice constants are identical with each other, and such that the first energy level of the first conduction band is located at an energetically lower level than the fourth energy level of the second valence band;

said second group III-V compound semiconductor material being doped by the impurity atoms to a concentration level such that the Fermi level is located between the third and fourth energy levels of the second group III-V compound semiconductor material.

2. A semiconductor device as claimed in claim 1 in which said first group III-V compound semiconductor material comprises indium arsenide.

3. A semiconductor device as claimed in claim 1 in which said first group III-V compound semiconductor material comprises a mixed crystal of indium arsenide and indium antimonide.

4. A semiconductor device as claimed in claim 1 in which said second group III-V compound semiconductor material comprises a mixed crystal of aluminum antimonide and gallium antimonide having a composition $Al_yGa_{1-y}Sb$, with a compositional parameter y set to fall in the range of $0 \leq y < 0.3$, and in which the second group III-V compound semiconductor material is doped to a concentration level of at least $3 \times 10^{17}$ cm$^{-3}$.

5. A semiconductor device as claimed in claim 4 in which said second group III-V compound semiconductor material is doped to the concentration level of $1 \times 10^{18}$ cm$^{-3}$.

6. A semiconductor device as claimed in claim 1 in which said second group III-V compound semiconductor material comprises a mixed crystal of gallium arsenide antimonide having a composition $GaAs_ySb_{1-y}$ with a compositional parameter y in the range of $0 \leq y \leq 0.6$, and in which said second group III-V compound semiconductor material is doped to the concentration level of at least $3 \times 10^{17}$ cm$^{-3}$ or more.

7. A semiconductor device as claimed in claim 1 in which said second group III-V compound semiconductor material comprises a mixed crystal of aluminum gallium arsenide antimonide having a composition $Al_yGa_{1-y}As_zSb_{1-z}$ with the compositional parameters y and z set to fall in the range of $0 \leq y < 0.3$ and $0 \leq z < 0.6$, said second group III-V compound semiconductor material being doped to the concentration level of at least $3 \times 10^{17}$ cm$^{-3}$.

8. A semiconductor device, comprising:

a substrate having an upper major surface and a lower major surface;

a channel layer having an upper major surface and a lower major surface and provided on the upper major surface of the substrate, said channel layer comprising an undoped first group III-V compound semiconductor material having a first lattice constant and containing indium arsenide as a component, said first group III-V compound semiconductor material having a first conduction band characterized by a first energy level at the upper major surface of the channel layer and a first valence band characterized by a second energy level at the upper major surface of the channel layer such that the second energy level is separated from the first energy level by a first band energy gap;

a two-dimensional electron gas formed in the channel layer along the upper major surface thereof as a substantially scatter-free path of electrons;

an electron supplying layer having an upper major surface and a lower major surface and provided on the upper major surface of the channel layer so as to form a heterojunction interface between the upper major surface of the channel layer and the lower major surface of the electron supplying layer, said electron supplying layer comprising a second group III-V compound semiconductor material having a second lattice constant and doped to the n-type by a doping of impurity atoms and supplying electrons to the channel layer to form the two-dimensional electron gas therein, said second group III-V compound semiconductor material containing aluminum and at least another group III element simultaneously;

source electrode means provided on the upper major surface of the electron supplying layer for injecting electrons into the electron supplying layer;

drain electrode means provided on the upper major surface of the electron supplying layer for collecting electrons from the electron supplying layer; and gate electrode means provided on the upper major surface of the electron supplying layer for controlling the passage of the electrons in the two-dimensional electron gas;

said second group III-V compound semiconductor material having a second conduction band characterized by a third energy level at the lower major surface of the electron supplying layer and a second valence band characterized by a fourth energy level at the lower major surface of the electron supplying layer such that the fourth energy level is separated from the third energy level by a second band gap, said second group III-V compound semiconductor material having a composition determined such that the second lattice constant matches to the first lattice constant so that the passage of the electrons through the two-dimensional electron gas occurs substantially identical with a case wherein the first and second lattice constants are identical with each other, and such that the first energy level of the first conduction band is located at an energetically higher level than the fourth energy level of the second valence band.

9. A semiconductor device as claimed in claim 8 in which said second compound semiconductor material comprises a mixed crystal of AlGaSb having a composition of $Al_yGa_{1-y}Sb$ with the compositional parameter y set to fall in the range of $0.3 \leq y < 1$.

10. A semiconductor device as claimed in claim 9 in which said compositional parameter y is set to fall in the range of $0.3 \leq y \leq 0.6$.

11. A semiconductor device as claimed in claim 8 in which said second compound semiconductor material comprises a mixed crystal of AlInAs having a composition of $Al_yIn_{1-y}As$ with the compositional parameter y determined to fall in the range of $0.06 \leq y \leq 0.6$.

12. A semiconductor device as claimed in claim 8 in which said second compound semiconductor material comprises a mixed crystal of AlGaAsSb having a composition of $Al_yGa_{1-y}As_zSb_{1-z}$ with the compositional parameters y and z determined to fall in the range of $0.3 \leq y < 0.6$ and $0 \leq z \leq 0.6$, respectively.

13. A semiconductor device as claimed in claim 8 in which said second compound semiconductor material comprises a mixed crystal of ZnSeTe having a composition of $ZnSe_yTe_{1-y}$ with the compositional parameter y determined to fall in the range of $0 \leq y \leq 0.6$.

* * * * *